ulating signal. A signal generating unit generates including

United States Patent
Yamashita

(10) Patent No.: US 7,477,168 B2
(45) Date of Patent: Jan. 13, 2009

(54) APPARATUS FOR AND METHOD OF PROCESSING DATA

(75) Inventor: Shigeyuki Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/709,001

(22) Filed: Feb. 21, 2007

(65) Prior Publication Data

US 2007/0194954 A1 Aug. 23, 2007

(30) Foreign Application Priority Data

Feb. 23, 2006 (JP) ............................ P2006-047096

(51) Int. Cl.
*H03M 5/00* (2006.01)
(52) U.S. Cl. ............................ 341/55; 341/100; 341/59
(58) Field of Classification Search ................ 341/100, 341/101, 50, 61, 58, 59, 55
See application file for complete search history.

(56) References Cited

U.S. PATENT DOCUMENTS

| 5,606,317 A * | 2/1997 | Cloonan et al. ............... 341/58 |
| 6,011,497 A * | 1/2000 | Tsang et al. ................... 341/59 |
| 7,102,553 B2 * | 9/2006 | Tokuhiro ....................... 341/101 |

* cited by examiner

*Primary Examiner*—Peguy JeanPierre
(74) *Attorney, Agent, or Firm*—Frommer Lawrence & Haug LLP; William S. Frommer; Thomas F. Presson

(57) ABSTRACT

A data processing apparatus for processing a plurality of input signals to increase the number of bits thereof to disperse 0s and 1s therein and then converting the input signals into a serial signal. A signal generating unit generates including signal generating means for generating the serial signal having a second bit rate which is represented by the product of a first bit rate of the input signals, the number of the input signals, and a ratio of a bit length after the number of bits is increased to a bit length before the number of bits is increased.

9 Claims, 7 Drawing Sheets

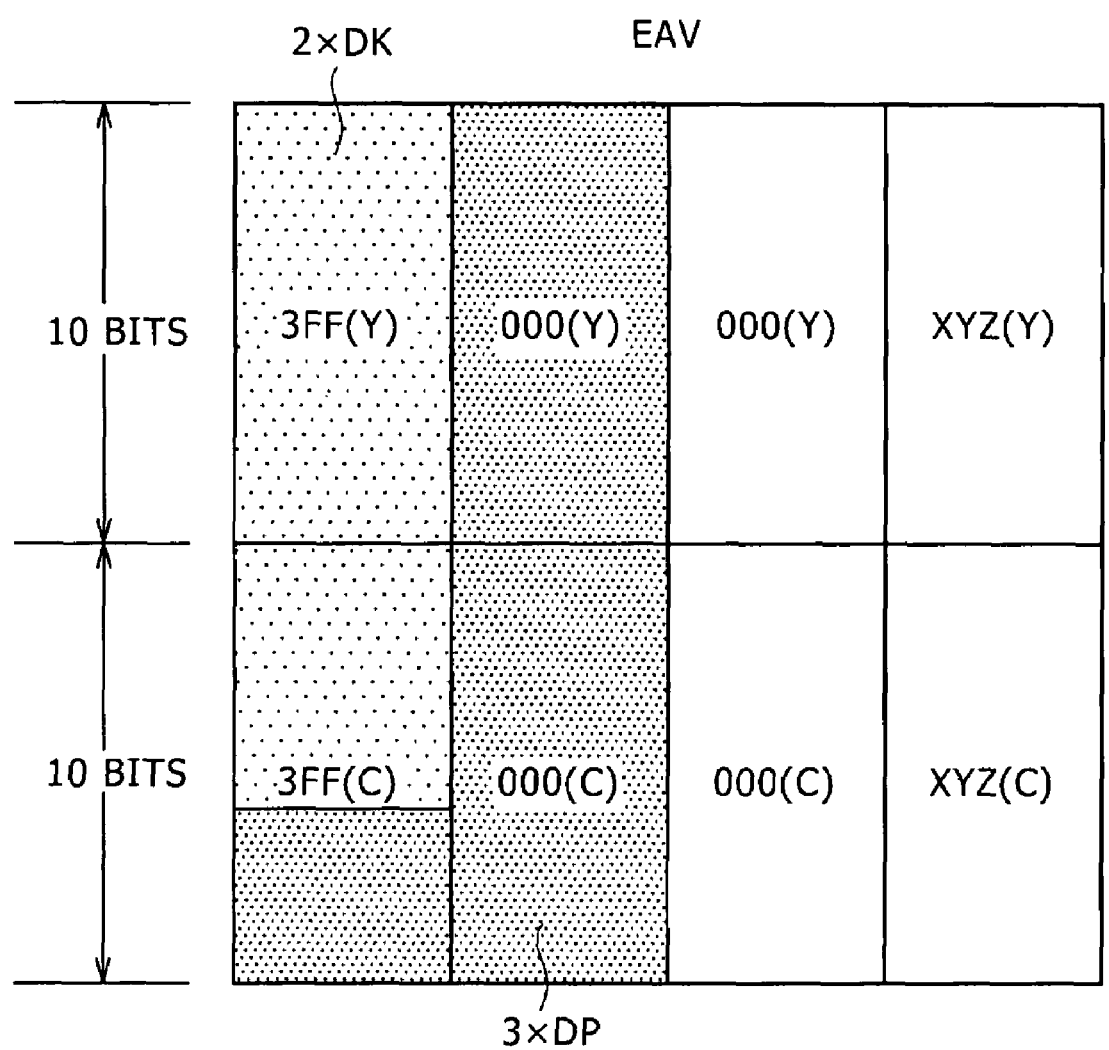

APPARATUS FOR AND METHOD OF PROCESSING DATA

CROSS REFERENCES TO RELATED APPLICATIONS

The present invention contains subject matter related to Japanese Patent Application JP 2006-047096 filed in the Japanese Patent Office on Feb. 23, 2006, the entire contents of which being incorporated herein by reference.

BACKGROUND OF THE INVENTION

1. Field of the Invention

The present invention relates to an apparatus for and a method of processing data to generate bit sequence data, for use in the transmission of a serial digital video signal based on bit sequence data having a bit rate according to predetermined standards.

2. Description of the Related Art

In the art of video signal processing, efforts have positively been made to employ digital video signals for the purpose of transmitting a variety of video information and achieving a high quality level of reproduced images. There has already been proposed a high-definition television (HDTV) system for handing digital video signals based on digital data representative of video signal information. According to the HDTV system, a digital video signal (hereinafter referred to as "HD signal") is generated as a word sequence data according to a predetermined data format. HD signals available for the HDTV system include digital video signals in the YCbCr format and digital video signals in the RGB format. In the YCbCr format, Y represents a luma signal component and Cb and Cr chroma signal components. In the RGB format, R, G, B represent red, green, and blue primary signal components.

For transmitting an HD signal over a signal transmission path in the form of an optical signal transmission cable such as a coaxial cable or an optical fiber, for example, the HD signal should desirably be converted from word sequence data into bit sequence data (serial digital video signal) for transmission because the serial video signal transmission allows the signal transmission path to be simplified. For the serial transmission of HD signals, standards have been established by SMPTE (Society of Motion Picture and Television Engineers). HD signals are transmitted according to HD SDI (High-Definition Serial Digital Interface) standardized in the SMPTE 292M standard established by SMPTE (see SMPTE STANDARD for Television and Digital Cinema SMPTE 425M-200x).

For the transmission according to HD SDI, it has been specified by the standards that a serial digital video signal based on bit sequence data transmitted over a signal transmission path in the form of an optical signal transmission cable such as a coaxial cable or an optical fiber have a data rate (a bit rate) of 1.485 Gb/s or 1.485/1.001 Gb/s (according to the present invention, both bit rates will be referred to as 1.485 Gb/s). In other words, a serial digital video signal to be transmitted according to HD SDI (hereinafter referred to as "HD-SDI signal") has a bit rate of 1.485 Gb/s.

SUMMARY OF THE INVENTION

At present, signal format and coaxial interface physical layer standards for multiplexing signals, which can be multiplexed and transmitted as two HD-SID signals, such as 1920×1080/50P, 60P/4:2:2/10 bits, 1920×1080/24P, 25P, 30P, 50I, 60I/4:4:4/10 bits, 12 bits, prescribed under SMPTE 372M, at 2.97 Gb/s (3 Gb/s) and transmitting the multiplexed signal over a single coaxial cable, have been proposed according to SMPTE 425M. However, no standards for optical interfaces have been proposed.

Channel coding for the proposed coaxial physical layer standards is a scrambling process which is the same as with the present HD-SDI process, and tends to cause a pattern with many DC components or a pattern with many successions of 0s or 1s, which is known as a so-called pathological pattern.

Inexpensive optical devices such as semiconductor lasers and PIN photodiodes are not available for use in the 3 Gb/s band.

It is desirable to provide an apparatus for and a method of processing data to generate a serial signal having a bit rate necessary for optical interfaces, based on a plurality of input signals.

To achieve the above scope, there is provided in accordance with an embodiment of the present invention a data processing apparatus for processing a plurality of input signals to increase the number of bits thereof to disperse 0s and 1s therein and thereafter converting the input signals into a serial signal, including signal generating means for generating the serial signal having a second bit rate which is represented by the product of a first bit rate of the input signals, the number of the input signals, and a ratio of a bit length after the number of bits is increased to a bit length before the number of bits is increased.

According to another embodiment of the present invention, there is also provided a method of processing a plurality of input signals to increase the number of bits thereof to disperse 0s and 1s therein and thereafter converting the input signals into a serial signal, including the step of generating the serial signal having a second bit rate which is represented by the product of a first bit rate of the input signals, the number of the input signals, and a ratio of a bit length after the number of bits is increased to a bit length before the number of bits is increased.

With the arrangement of the present invention, the data processing apparatus and method are capable of generating a serial signal having a bit rate necessary for optical interfaces, based on a plurality of input signals.

BRIEF DESCRIPTION OF THE DRAWINGS

FIG. 4 is a diagram showing data formats by the signal processing apparatus shown in FIG. 1 while it is in operation;

DETAILED DESCRIPTION OF THE PREFERRED EMBODIMENTS

Figure 1:
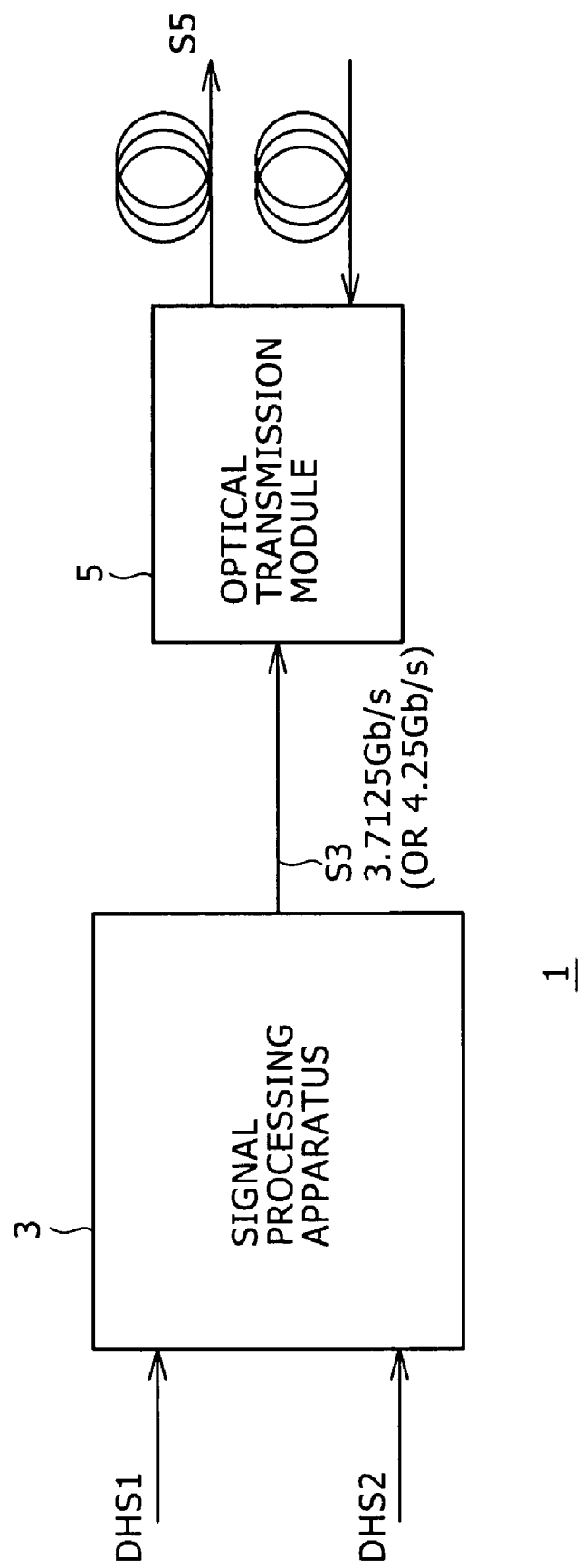
FIG. 1 is a block diagram of a communication system which incorporates a signal processing apparatus according to an embodiment of the present invention.

Embodiments of the present invention will be described below.

First, signals and standards used in the embodiments of the present invention will be described below.

<Signal Format>

Digital video data according to D1, D2, and HTDV are produced by quantizing a luma signal (Y) and chroma signals (CB/CR) with 10 bits (8 bits), and arranging the quantized data in a chronological sequence of a timing reference signal SAV (Start of Active Video), a digital effective line, timing reference signal EAV (End of Active Video), line number data, error detecting code data, and ancillary/undefined word data in the order of line numbers.

Of the four words of the timing reference signals SAV, EAV, the first three words (3FFh, 000h, 000h) are used to establish word synchronization and horizontal synchronization, and the last word (XYZh) is used to identify first and second fields of one frame and also to identify SAV and EAV.

The luma signal and the chroma signals are multiplexed in the order of "CB/CR, Y, CB/CR, Y, CB/CR, Y, CB/CR, Y, . . . ," converted from the parallel format into the serial format, scrambled, and converted into an electric signal or an optical signal, which is then transmitted. The receiver inversely converts the received signal to reproduce the original signals. The scrambling process regards the input serial signal as a polynomial, divides it by a ninth-order primitive polynomial "X9+X4+1", successively, and transmitting the quotient to statistically set the mark percentage (a proportion of 1s and 0s) of the transmitted data to ½ on the average. At the same time, the scrambling process performs encryption based on the primitive polynomial. The quotient is further divided by X+1 to produce polarity-free data (the data and its inverted data represent the same information), which is transmitted. The receiver multiplies the transmitted data by X+1, and then multiplies the product by the primitive polynomial "X9+X4+1" to reproduce the original data.

<1080/60P Signal>

The present HDTV system is a 1080/60I interlace system. A video signal used in the next-generation HDTV system is a 1080/60P progressive HDTV signal. A parallel signal format is determined by SMPTE 274M as follows:

(1) The number of active samples: 1920 samples/line;
(2) The number of active lines: 1080 lines/frame;
(3) Frame rate: 60 Hz, 60 Hz/1.001 (Progressive);
(4) Sampling frequency: 148.5 MHz or 148.5 MHz×1000/1001; and
(5) Quantization: 8 bits or 10 bits (or 12 bits).

The parallel interface is defined as:

(A1) RGB system: 8 bits×3=24 bits or 10 bits×2=20 bits; and
(A2) Y,CB/CR system: 8 bits×2=16 bits or 10 bits×2=20 bits.

Though the 10-bit quantization is popular at present, there are growing demands for the 12-bit quantization in view of higher image quality to be achieved in the future.

<D-Cinema Signal of 1080/24P·30P/4:4:4/10 bits, 12 bits>

D-Cinema (E-Cinema) stands for Digital-Cinema (Electric-Cinema).

A 24P system parallel signal format is determined by SMPTE 274M as follows:

(B1) The number of active samples: 1920 samples/line;
(B2) The number of active lines: 1080 lines/frame;
(B3) Frame rate: 24 Hz, 24 Hz/1.001, 30 Hz, 30 Hz/1.001 (Progressive);
(B4) Sampling frequency: 74.25 MHz or 74.25 MHz×1000/1001; and
(B5) Quantization: 8 bits or 10 bits.

The parallel interface is defined as:

(C1) RGB system: 8 bits×3=24 bits or 10 bits×3=30 bits; and
(C2) Y,CB/CR system: 8 bits×2=16 bits or 10 bits×2=20 bits.

The serial transmission of signals for the 4:2:2 (Y,CB/CR)/8 bits, 10bits system has been standardized using present HD SDI. However, a serial signal transmission process for a 12-bit quantization system and a 4:4:4 (R,G,B)/8 bits, 10 bits, 12 bits, . . . system has not been standardized.

According to HD SDI, high-order four patterns and low-order four patterns, i.e., 000h through 003h and 3FFh through 3FCh, are inhibited codes. Since these patterns are used as flags of SAV, EAV, or ancillary data, they cannot be used as data. For the D-Cinema signal, however, there are strong demands to use all words without providing inhibited codes.

<Camera Transmission System>

Camera systems for use in broadcasting stations generally use a plurality of cameras to capture images of a subject. Video signals from the cameras are a Y,CB/CR signal or G,B,R signals according to the above signal format, and transmitted to a CCU (Camera Control Unit) (or VTR). In the Y,Pb/Pr system, a D1 signal has a bit rate of 270 Mb/s, and an HD signal has a bit rate of 1.485 Gb/s. In order that the operator of a camera is able to know what scene another camera is capturing, the monitor screen of the camera displays the image from the other camera. The monitor image is called return video, and is transmitted from the CCU (or VTR) to the camera. Since return video may not necessarily be of high image quality, it is represented by an MPEG compressed signal and transmitted at a low bit rate of several Mb/s to several hundreds Mb/s. A prompter signal is also transmitted to display the script for an announcer. The prompter signal also has a low bit rate of about several Mb/s. The cameras are controlled by the CCU, and all the cameras, the CCR, and the VTR are operated in synchronism with the system clock.

<SMPTE 3 Gb/s Standards>

Signal multiplexing formats include SMPTE 425M and SMPTE 424M as coaxial interface physical layer standards. According to the signal multiplexing formats, signals, which can be multiplexed and transmitted as two HD-SID signals, such as 1920×1080/50P, 60P/4:2:2/10 bits, 1920×1080/24P, 25P, 30P, 50I, 60I/4:4:4/10 bits, 12 bits, prescribed under SMPTE 372M, are multiplexed at 2.97 Gb/s (3 Gb/s) and transmitted over a signal coaxial cable. There are prescribed two signal multiplexing formats, i.e., a proposed direct mapping format unique to the G company and a multiplexing format that is compatible with SMPTE 372M. These formats are identified by Format IDs. Channel coding is a scrambling process which is the same as with the present HD-SDI process. The coaxial physical layer standards are similar to the coaxial standards of SMPTE 292M.

According to SMPTE 425M, 424M, no standards have been proposed for an optical interface. According to the present invention, a system for generating a serial signal having a bit rate of 3.7125 Gb/s or 4.25 Gb/s compatible with an optical interface is disclosed.

FIG. 1 shows in block form a communication system 1 which incorporates a signal processing apparatus according to an embodiment of the present invention.

As shown in FIG. 1, the communication system 1 has a signal processing apparatus 3 and an optical transmission module 5.

The signal processing apparatus 3 is supplied with HD-SDI signals DHS1, DHS2 in channels n, each having a standardized bit rate of 1.485 Gb/s, and outputs a serial signal S3 having a bit rate of 3.7125 Gb/s (or 4.25 Gb/s) based on the supplied HD-SDI signals DHS1, DHS2.

The optical transmission module 5 transmits the serial signal S3 as an optical signal S5 over an optical fiber.

According to the embodiment shown in FIG. 1, HD-SDI signals DHS1, DHS2, . . . , DHSn in the channels n, each having a standardized bit rate of 1.485 Gb/s, are supplied as serial digital video signals in channels n, each in the form of bit sequence data having a standardized bit rate, to respective parallel data generators. Each of the HD-SDI signals DHS1, DHS2, DHSn in the channels n (n is an integer of 2 or greater) has a frame rate of 30 Hz, 25 Hz, or 24 Hz, for example. The number of effective lines in each frame and the number of effective words in each line are 1080 lines and 1920 words, respectively. The number of word bits (the number of quantized bits) is 10 bits, and the data format is the Y,CB/CR format. Each of these HD signals is supplied as a serial signal.

Figure 2:
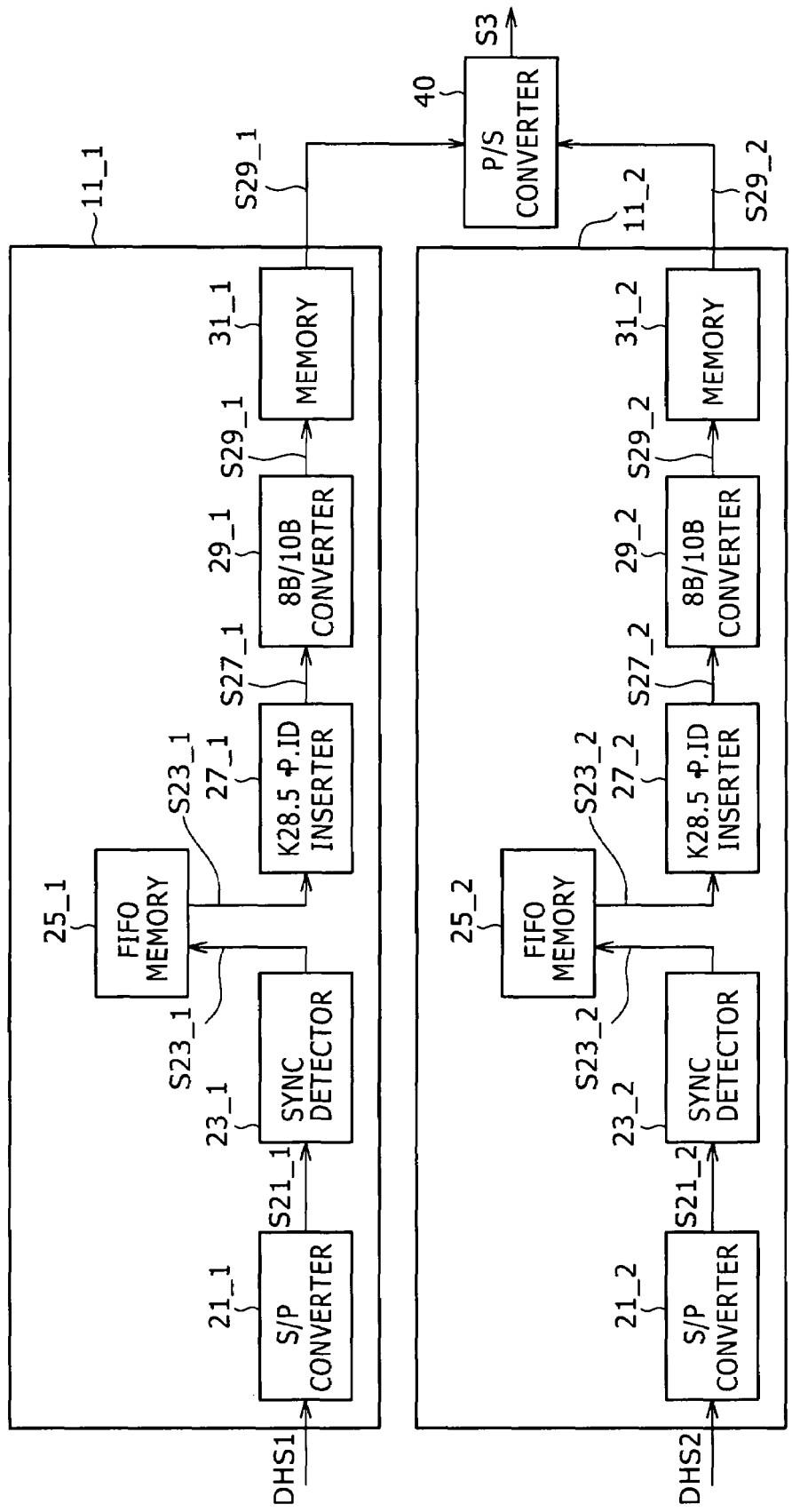
FIG. 2 is a block diagram of the signal processing apparatus shown in FIG. 1.

FIG. 2 shows in block form the signal processing apparatus 3 shown in FIG. 1.

As shown in FIG. 2, the signal processing apparatus 3 has a data processor 11-1 for processing the HD-SDI signal DHS1, a data processor 11-2 for processing the HD-SDI signal DHS2, and a P/S converter 40.

The data processor 11-1 includes an S/P converter 21-1, a synchronous detector 23-1, an FIFO memory 25-1, a K28.5·P.ID inserter 27-1, an 8B/10B converter 29-1, and a memory 31-1.

The S/P converter 21-1 descrambles the HD-SDI signal DHS1 input as a serial signal, converts the descrambled serial signal into a parallel signal S21-1, and outputs the parallel signal S21-1 to the synchronous detector 23-1.

Figure 3:
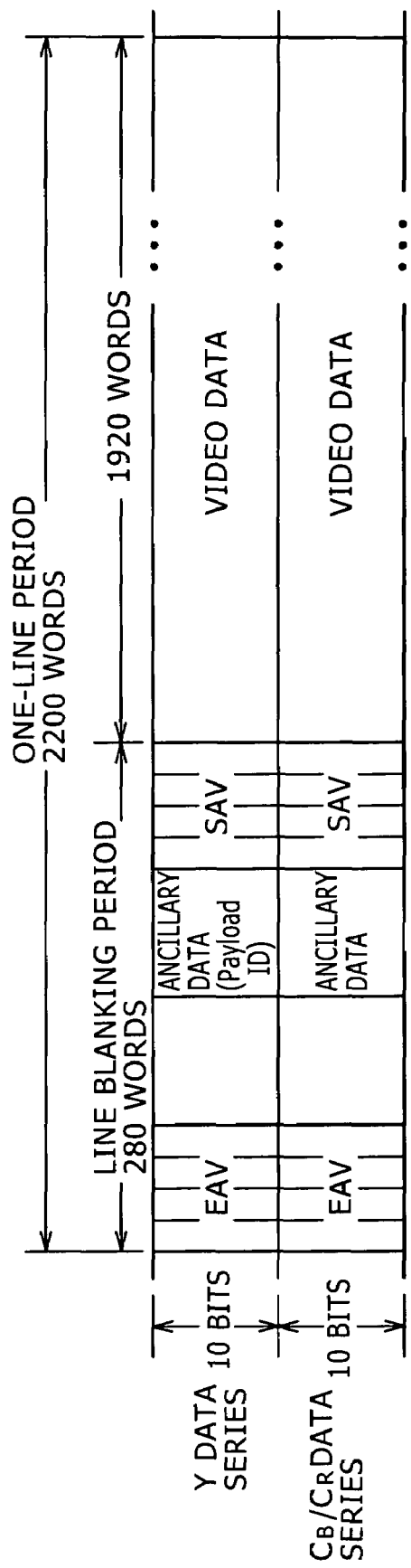
FIG. 3 is a diagram showing data formats by the signal processing apparatus shown in FIG. 1 while it is in operation.

The parallel signal S21-1 includes word sequence data having a line-specific data structure shown in FIG. 3, for example.

The line-specific data structure shown in FIG. 3 is made up of a Y data series including a video data part representative of luma signal information of a video signal and a line blanking part, and a CB/CR data series including a video data part representative of chroma signal information of the video signal and a line blanking part.

Each of the Y data series and the CB/CR data series has word data whose words bits are 10 bits. The Y data series and the CB/CR data series are parallel to each other in synchronism with each other, and provide 20-bit word sequence data as a whole. The Y data series and the CB/CR data series have a word rate of 74.25 Mb/s or 74.25/1.001 Mb/s (according to the present invention, both word rates will be referred to as 74.25 Mb/s).

Each of the line blanking parts of the Y data series and the CB/CR data series includes 4-word timing reference code data SAV (Start of Active Video) positioned immediately prior to the video data part and 4-word timing reference code data EAV (End of Active Video) positioned immediately subsequent to the video data part. The four words of each of the timing reference code data SAV, EAV are expressed as 3FF, 000, 000, XYZ according to the hexadecimal notation. Each of 3FF and 000 is an inhibited code which is not used as a word in the video data part. The combination of 3FF, 000, 000, XYZ does not appear in the video data part.

Each of the line blanking parts of the Y data series and the CB/CR data series includes ancillary data in addition to other data between the timing reference code data SAV and the timing reference code data EAV. The ancillary data in the line blanking part of the Y data series includes 4-word identification data: Payload ID which represents information about the video data of the HD signal.

The line-specific data structure shown in FIG. 3 is employed when the HD-SDI signal has a frame rate of 30 Hz. Therefore, each of the Y data series and the CB/CR data series has a line period of 2200 words, where the line blanking part includes 280 words and the video data part includes 1920 words.

The synchronous detector 23-1 detects the timing reference code data SAV, EAV contained in the parallel signal S21-1 input from the S/P converter 21-1, establishes bit synchronization and word synchronization based on the detected timing reference code data SAV, EAV (performs forward and backward protection), and detects the frame rate of the parallel signal S21-1.

The synchronous detector 23-1 writes 20 bits, at a time, of the parallel signal S21-1 as word sequence data S23-1 into the FIFO memory 25-1 based on a write clock signal QW1 having a frequency of 74.25 MHz.

40 bits, at a time, of the word sequence data S23-1 written in the FIFO memory 25-1 are read therefrom based on a read clock signal QR1 having a frequency of 74.25/2 MHz=37.125 MHz, and output to the K28.5·P.ID inserter 27-1.

As shown in FIG. 4, the K28.5·P.ID inserter 27-1 replaces a total of 40 bits of four words (3FF(C), 3FF(Y), 000(C), 000(Y)) out of the eight words (3FF(C), 3FF(Y), 000(C), 000(Y), 000(C), 000(Y), XYZ(C), XYZ(Y): (Y) indicates that the word is a word in the Y data series and (C) indicates that the word is a work in the CB/CR data series) of the timing reference code data SAV or EAV in each of the line blanking parts of the word sequence data S23-1, with two 8-bit word data DK and three 8-bit word data DP, thereby inserting the 8-bit word data DK, DP into the word sequence data S23-1.

When each of the two 8-bit K28.5·P.ID (word data) is subjected to 8B/10B conversion, it is converted into 10-bit word data (8-bit word data: HGFEDCBA=10111100) called a code name "K28.5" which is not used as word data representing video signal information.

When each of the three 8-bit word data DP is subjected to 8B/10B conversion, it is converted into data functioning as identification data: Payload ID which are three 10-bit word data corresponding to the first through third three words out of the four words of the identification data: Payload ID contained as ancillary data in the word sequence data Dh1.

The K28.5·P.ID inserter 27-1 delivers and outputs 40 bits, at a time, of word sequence data S27-1 with the two 8-bit word data K28.5·P.ID and the three 8-bit word data DP inserted therein, to the 8B/10B converter 29-1.

The 8B/10B converter 29-1 performs 8B/10B conversion on the word sequence data S27-1 to convert 40 bits thereof into 50 bits at successive times, thereby generating word sequence data S29-1. Then, the 8B/10B converter 29-1 writes the word sequence data S29-1 into the memory 31-1.

The data processor 11-2 processes the HD-SDI signal DHS2 in the same manner as the data processor 11-1, and writes word sequence data S29-2 into the memory 31-2.

The P/S converter 40 reads the word sequence data S29-1, S29-2 from the respective memories 31-1, 31-2, generates a serial signal S3 having a bit rate of 3.7125 Gb/s or 4.25 Gb/s compatible with an optical interface, and outputs the serial signal S3 to the optical transmission module 5 shown in FIG. 1. If necessary, the P/S converter 40 adds additional data to each line to generate the serial signal S3 of 3.7125 Gb/s or 4.25 Gb/s.

Figure 5A:
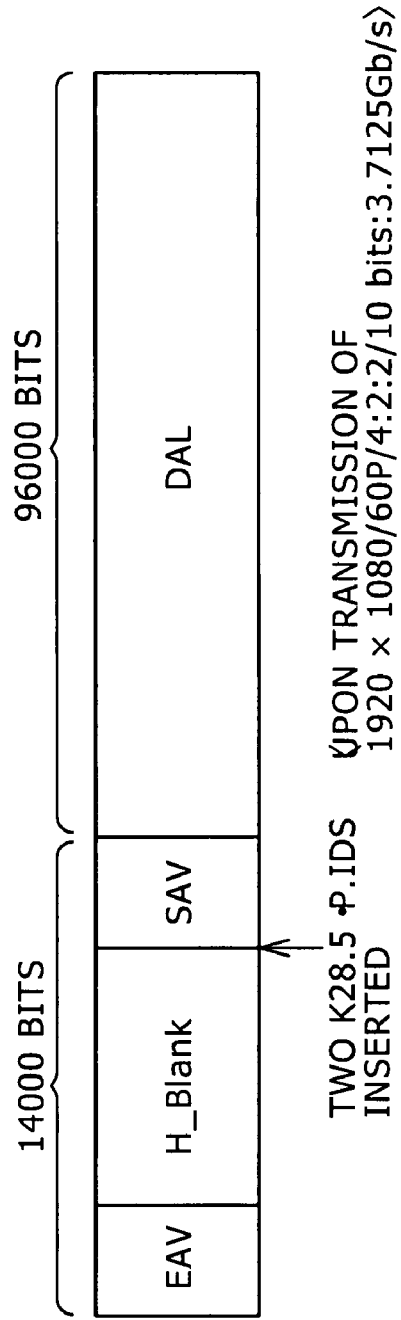
FIGS. 5A and 5B are diagrams showing formats of serial signals output from the signal processing apparatus shown in FIG. 1.
Figure 5B:
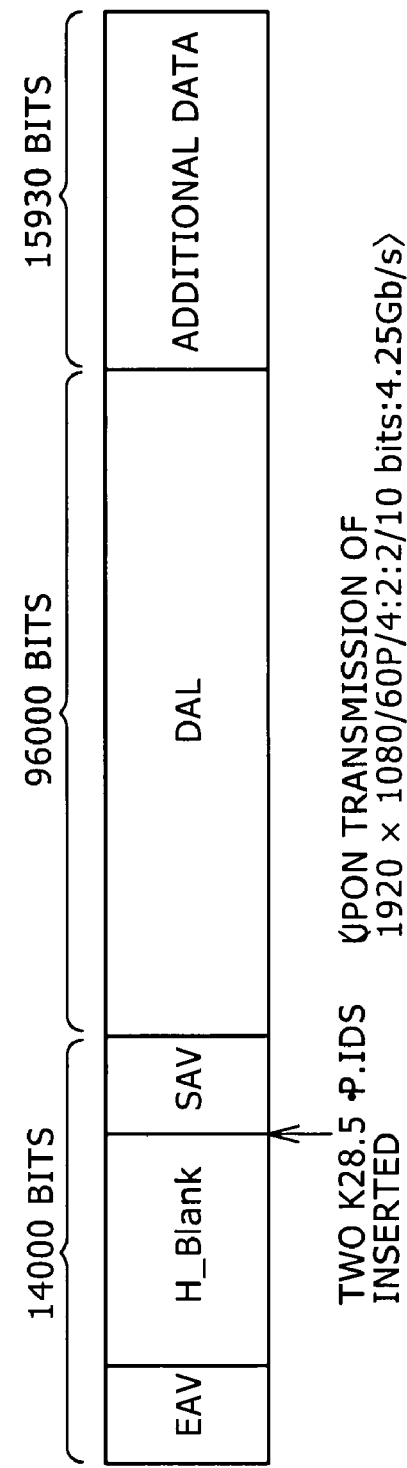

For the transmission of 1920×1080/60P/4:2:2/10 bits: 3.7125 Gb/s, the serial signal S3 has a format shown in FIG. 5A. For the transmission of 1920×1080/60P/4:2:2/10 bits: 4.25 Gb/s, the serial signal S3 has a format shown in FIG. 5B.

The optical transmission module 5 shown in FIG. 1 converts the serial signal S3 input from the P/S converter 40 into an optical signal S5, and transmits the optical signal S5 over an optical signal transmission cable or a coaxial cable including an optical fiber.

The optical transmission module 5 is of a 4.25 Gb/s Fiber Channel configuration. Since the optical transmission module 5 has only an electrical-to-optical converter (E/O) and an optical-to-electrical converter (O/E) and does not have a clock reproducing function, it can send and receive 8B/10B-converted signals having bit rates ranging from 1.0625 Gb/s to 4.25 Gb/s.

The optical transmission module 5 of the 4.25 Gb/s Fiber Channel configuration transmits optical signals having a wavelength of 850 nm. However, an optical transmission module for transmitting optical signals having a wavelength of 1300 nm is also feasible.

An optical transmission module that operates at a bit rate of 3.7125 Gb/s with a commercially available coaxial driver and equalizer may also be used for coaxial transmission of optical signals.

Operation of the signal processing apparatus 3 shown in FIG. 2 will be described below.

The HD-SDI signals DHS1, DHS2 are input respectively to the data processors 11-1, 11-2. The S/P converter 21-1 of the data processor 11-1 descrambles the HD-SDI signal DHS1, converts the descrambled serial signal into the parallel signal S21-1, and outputs the parallel signal S21-1 to the synchronous detector 23-1.

The synchronous detector 23-1 detects the timing reference code data SAV, EAV contained in the parallel signal S21-1 input from the S/P converter 21-1, establishes bit synchronization and word synchronization based on the detected timing reference code data SAV, EAV (performs forward and backward protection), and detects the frame rate of the parallel signal S21-1.

The synchronous detector 23-1 writes 20 bits, at a time, of the parallel signal S21-1 as word sequence data S23-1 into the FIFO memory 25-1 based on the write clock signal QW1 having a frequency of 74.25 MHz.

40 bits, at a time, of the word sequence data S23-1 written in the FIFO memory 25-1 are read therefrom based on the read clock signal QR1 having a frequency of 74.25/2 MHz=37.125 MHz, and output to the K28.5·P.ID inserter 27-1.

As shown in FIG. 4, the K28.5·P.ID inserter 27-1 replaces a total of 40 bits of four words (3FF(C), 3FF(Y), 000(C), 000(Y)) out of the eight words (3FF(C), 3FF(Y), 000(C), 000(Y), 000(C), 000(Y), XYZ(C), XYZ(Y): (Y) indicates that the word is a word in the Y data series and (C) indicates that the word is a work in the CB/CR data series) of the timing reference code data SAV or EAV in each of the line blanking parts of the word sequence data S23-1, with two 8-bit word data DK and three 8-bit word data DP, thereby inserting the 8-bit word data DK, DP into the word sequence data S23-1.

The K28.5·P.ID inserter 27-1 delivers and outputs 40 bits, at a time, of word sequence data S27-1 with the two 8-bit word data K28.5·P.ID and the three 8-bit word data DP inserted therein, to the 8B/10B converter 29-1.

The 8B/10B converter 29-1 performs 8B/10B conversion on the word sequence data S27-1 to convert 40 bits thereof into 50 bits at successive times, thereby generating word sequence data S29-1. Then, the 8B/10B converter 29-1 writes the word sequence data S29-1 into the memory 31-1.

At the same time that the data processor 11-1 processes the HD-SDI signal DHS1, the data processor 11-2 processes the HD-SDI signal DHS2, and writes word sequence data S29-2 into the memory 31-2.

The P/S converter 40 reads the word sequence data S29-1, S29-2 from the respective memories 31-1, 31-2, generates a serial signal S3 having a bit rate of 3.7125 Gb/s or 4.25 Gb/s compatible with an optical interface, and outputs the serial signal S3 to the optical transmission module 5 shown in FIG. 1. If necessary, the P/S converter 40 adds additional data to each line to generate the serial signal S3 of 3.7125 Gb/s or 4.25 Gb/s.

The optical transmission module 5 shown in FIG. 1 converts the serial signal S3 input from the P/S converter 40 into an optical signal S5, and transmits the optical signal S5 over an optical signal transmission cable or a coaxial cable including an optical fiber.

As described above, the signal processing apparatus 3 of the communication system 1 generates a serial signal S3 having a bit rate of 3.7125 Gb/s or 4.25 Gb/s which matches the optical interface standards for multiplexing the two HD-SDI signals DHS1, DHS2 and transmitting the multiplexed signal through the optical interface. At the bit rate indicated above, inexpensive optical devices such as semiconductor lasers and PIN photodiodes can be used.

In the signal processing apparatus 3, the 8B/10B converters 29-1, 29-2 perform the 8B/10B conversion to produce error-resistant signals which tend to produce a pattern with many DC components or a pattern with many successions of 0s or 1s, which is known as a so-called pathological pattern.

More specifically, according to the present invention, there have been devised a process of constructing a synchronous-transmission 3 Gb/s serial interface circuit, a signal processing method, and a data structure, using a 4.25 Gb/s Fiber Channel optical transceiver module. Using the 3 Gb/s serial interface, the communication system can be operated as a synchronous system, which is the same as the present system, in future camera-VTR systems.

There have also been developed a 3 Gb/s serial interface circuit configuration and a data structure, using a 4.25 Gb/s Fiber Channel optical module and device. The 3 Gb/s serial interface allows HD-SDI signals in two channels to be transmitted according to SMPTE 372M, and makes it possible to realize a video signal real-time interface in a superwide frequency band which is twice HD signals, such as for D-Cinema (2 k×1 k/4:4:1/12 bits) signals.

Since the 4.25 Gb/s Fiber Channel optical module and device are expected to find widespread use and to become inexpensive, the period of time in which it is developed, the expenditures with which it is developed, and the cost of its products can be saved.

Since HD-SDI signals are input to and output from the 3 Gb/s serial interface, it is compatible with the present HD system. If an SD signal is to be transmitted, then it is multiplexed with an HD-SDI signal according to SMPTE 349M for the transmission using the 3 Gb/s serial interface.

According to the scrambling process, signals to be transmitted tend to cause a pattern that is unfavorable to the transmission, such as a pathological pattern. However, 8B/10B codes are stable as they do not produce transmission data such as a pathological pattern.

A receiver for receiving the optical signal S5 transmitted by the communication system 1 has a signal processing IC for receiving a serial electrical signal having a bit rate of 3.7125 Gb/s or 4.25 Gb/s which has been reproduced by the 4.25 Gb/s Fiber Channel optical transceiver module.

The signal processing IC detects K28.5 for achieving byte alignment and also performing forward and backward protection.

Then, the signal processing IC performs 8B/10B decoding on the signal, replaces the K28.5 data with the original data, produces parallel HD signals, and outputs the parallel HD signals.

In the above embodiment, the signal processing apparatus 3 has the two data processors 11-1, 11-2. However, the signal processing apparatus may have three or more data processors.

A signal processing apparatus according to another embodiment of the present invention will be described below with reference to FIG. 6.

Figure 6:
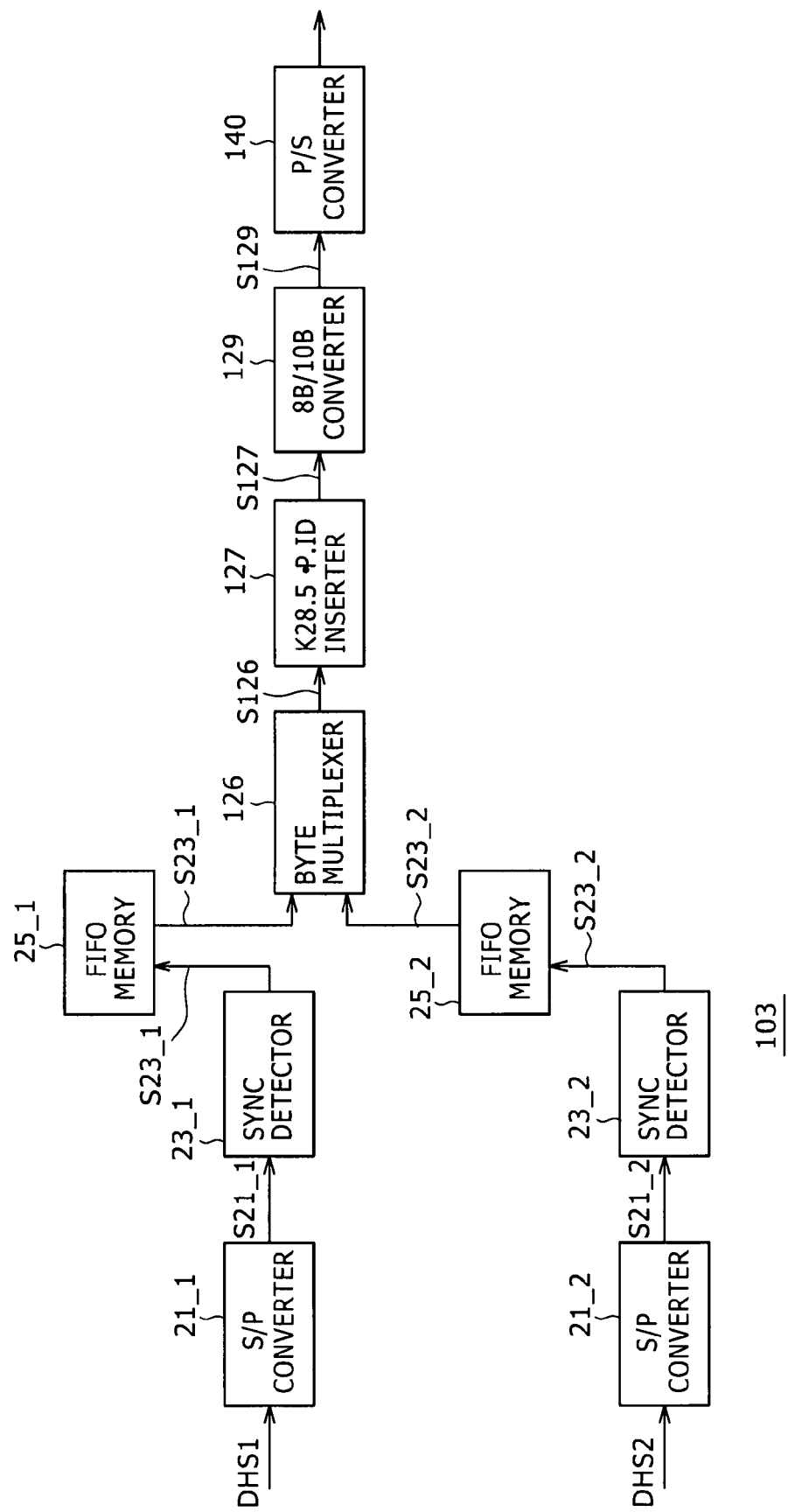
FIG. 6 is a block diagram of a signal processing apparatus according to a modification of the present invention.

FIG. 6 shows in block form a signal processing apparatus 103 according to the other embodiment of the present invention.

As shown in FIG. 6, the signal processing apparatus 103 includes an S/P converter 21-1, an S/P converter 21-2, a synchronous detector 23-1, a synchronous detector 23-2, an FIFO memory 25-1, an FIFO memory 25-2, a byte multiplexer 126, a K28.5·P.ID inserter 127, an 8B/10B converter 129, and a P/S converter 140.

The S/P converter 21-1, the synchronous detector 23-1, and the FIFO memory 25-1 process the HD-SDI signal DHS1 in the same manner as with the first embodiment.

Concurrently, the S/P converter 21-2, the synchronous detector 23-2, and the FIFO memory 25-2 process the HD-SDI signal DHS2 in the same manner as with the first embodiment.

For transmitting a serial signal, the signal processing apparatus 103 converts the HD-SDI signals DHS1, DHS2 in the two respective channels from serial signals into parallel signals and descrambles the parallel signals, using the S/P converter 21-1, the S/P converter 21-2, the synchronous detector 23-1, the synchronous detector 23-2, the FIFO memory 25-1, and the FIFO memory 25-2. Thereafter, the signal processing apparatus 103 brings the parallel signals into phase with each other using the FIFO memory 25-1 and the FIFO memory 25-2, to generate 10-bit parallel signals S23-1, S23-2 in the respective channels.

Figure 7:
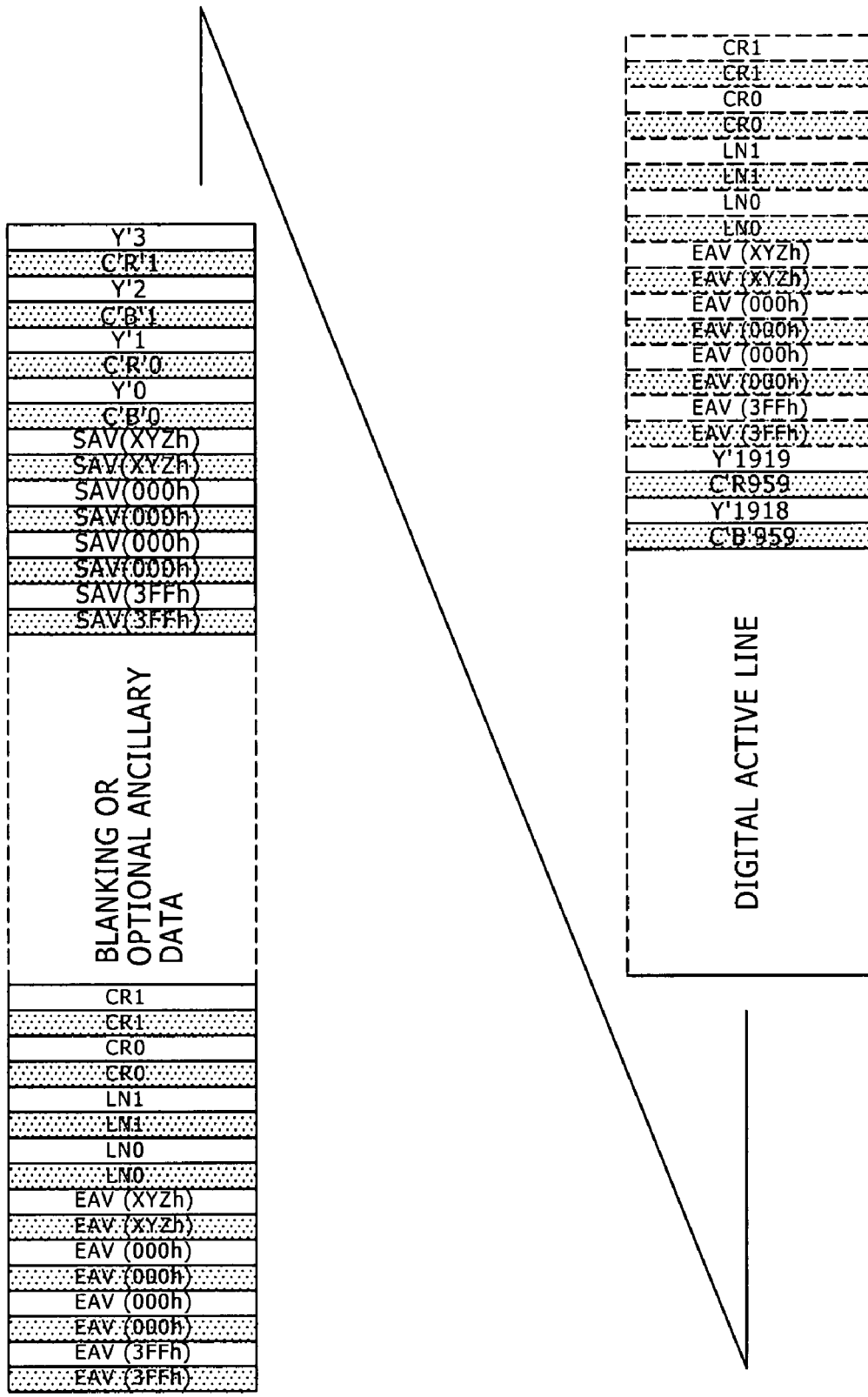
FIG. 7 is a format of a signal used by the signal processing apparatus shown in FIG. 6.

The byte multiplexer 126 multiplexes the 10-bit parallel signals S23-1, S23-2 to generate a 10-bit multiplexed signal S126 shown in FIG. 7 according to SMPTE 424M.

The K28.5·P.ID inserter 127 replaces five bytes, from the leading end of its SAV or EAV, of the multiplexed signal S126, with K28.52 bytes and P_ID 3 bytes for word synchronization of the 8B/10B code, thereby generating a multiplexed signal S127.

Then, the 8B/10B converter 129 performs 8B/10B conversion on the multiplexed signal S127 to generate a serial signal S129 having a bit rate of 3.7125 Gb/s. The P/S converter 140 converts the serial signal S129 into a parallel signal, which is transmitted from the signal processing apparatus 103.

A signal processing apparatus of a receiver for receiving the parallel signal transmitted by the communication system is supplied with a serial electrical signal having a bit rate of 3.7125 Gb/s (or 4.25 Gb/s) which has been reproduced by the 4.25 Gb/s Fiber Channel optical transceiver module.

The signal processing apparatus of the receiver detects K28.5 for achieving byte alignment and also performing forward and backward protection. Thereafter, the signal processing apparatus performs S/P conversion and 8B/10B decoding on the signal, replaces the K28.5 data with the original data, produces parallel HD signals in two channels, and outputs the parallel HD signals.

Although certain preferred embodiments of the present invention have been shown and described in detail, it should be understood that various changes and modifications may be made therein without departing from the scope of the appended claims.

What is claimed is:

1. A data processing apparatus for processing a plurality of input signals to increase a number of bits, to disperse 0s and 1s and then convert the input signals having an increased number of bits into a serial signal, comprising:
   signal generating means for generating said serial signal having a second bit rate which is represented by a product of a first bit rate of said input signals, the increased number of bits of said input signals, and a ratio of a bit length after said number of bits is increased to a bit length before said number of bits is increased.

2. The data processing apparatus according to claim 1, wherein said signal generating means comprises:
   a plurality of data processing means for processing said plurality of input signals, respectively; and
   serial signal generating means for generating said serial signal;
   wherein each of said data processing means includes:
      inserting means for, before a first data sequence of the input signal is bit-extended, inserting synchronizing data of a predetermined pattern which is not generated by bit-extending said first data sequence, into said first data sequence; and
      extending means for extending said first data sequence with said synchronizing data inserted by said inserting means to disperse 0s and 1s for generating a second data sequence, and
   said serial signal generating means generates said serial signal having said second bit rate from a plurality of said second data sequences generated respectively by said plurality of data processing means.

3. The data processing apparatus according to claim 2, wherein said synchronizing data comprises 16-bit word synchronization data, and said extending means includes means for performing an 8B/10B conversion process on said first data sequence.

4. The data processing apparatus according to claim 1, wherein said second bit rate is 3.7125 Gb/s or 4.25 Gb/s.

5. A method of processing a plurality of input signals to increase a number of bits thereof to disperse 0s and 1s and then converting the input signals having an increased number of bits into a serial signal, comprising the step of:
   generating said serial signal having a second bit rate which is represented by a product of a first bit rate of said input signals, the increased number of bits of said input signals, and a ratio of a bit length after said number of bits is increased to a bit length before said number of bits is increased.

6. The method according to claim 5, wherein said step of generating said serial signal comprises the steps of:
   processing said plurality of input signals, respectively; and
   generating said serial signal;
   wherein each of said steps of processing said input signals includes the steps of:
      before a first data sequence of the input signal is bit-extended, inserting synchronizing data of a predetermined pattern which is not generated by bit-extending said first data sequence, into said first data sequence, and
      extending said first data sequence with said synchronizing data inserted to disperse 0s and 1s and then generating a second data sequence, and
   said step of generating said serial signal includes the step of generating said serial signal having said second bit rate from a plurality of said second data sequences generated respectively by said steps of processing said plurality of input signals.

7. The method according to claim 6, wherein said synchronizing data comprises 16-bit word synchronization data, and said step of extending said first data sequence includes the step of performing an 8B/10B conversion process on said first data sequence.

8. The method according to claim 5, wherein said second bit rate is 3.7125 Gb/s or 4.25 Gb/s.

9. A data processing apparatus for processing a plurality of input signals to increase a number of bits thereof to disperse 0s and 1s then converting the input signals having an increased number of bits into a serial signal, comprising:
a signal generating section configured to generate said serial signal having a second bit rate which is represented by a product of a first bit rate of said input signals, the increased number of bits of said input signals, and a ratio of a bit length after said number of bits is increased to a bit length before said number of bits is increased.

* * * * *